United States Patent
Chang et al.

(10) Patent No.: US 11,403,170 B2
(45) Date of Patent: Aug. 2, 2022

(54) METHOD AND DEVICE FOR MONITORING DATA ERROR STATUS IN A MEMORY

(71) Applicant: Macronix International Co., Ltd., Hsinchu (TW)

(72) Inventors: Kuen Long Chang, Taipei (TW); Ken Hui Chen, Hsinchu (TW); Su Chueh Lo, Hsinchu (TW); Chia-Feng Cheng, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 218 days.

(21) Appl. No.: 16/520,342

(22) Filed: Jul. 23, 2019

(65) Prior Publication Data

US 2019/0347159 A1    Nov. 14, 2019

Related U.S. Application Data

(63) Continuation-in-part of application No. 14/596,768, filed on Jan. 14, 2015, now Pat. No. 10,379,926.

(60) Provisional application No. 62/033,622, filed on Aug. 5, 2014.

(51) Int. Cl.
| | |
|---|---|
| *G06F 11/10* | (2006.01) |
| *G06F 11/07* | (2006.01) |
| *G11C 29/42* | (2006.01) |
| *G11C 11/409* | (2006.01) |
| *G11C 29/48* | (2006.01) |
| *G06F 11/14* | (2006.01) |

(52) U.S. Cl.
CPC ...... *G06F 11/1048* (2013.01); *G06F 11/0793* (2013.01); *G06F 11/1438* (2013.01); *G11C 11/409* (2013.01); *G11C 29/42* (2013.01); *G11C 29/48* (2013.01)

(58) Field of Classification Search
CPC ............. G06F 11/1048; G06F 11/0793; G06F 11/1438; G06F 9/30101; G06F 9/30112; G11C 11/409; G11C 29/42; G11C 29/48
See application file for complete search history.

(56) References Cited

U.S. PATENT DOCUMENTS

| | | | | |
|---|---|---|---|---|
| 6,161,162 A | * | 12/2000 | DeRoo | ................. G06F 9/4401 711/E12.1 |
| 6,199,140 B1 | | 3/2001 | Srinivasan et al. | |
| 9,274,586 B2 | | 3/2016 | Iyer et al. | |
| 2004/0102916 A1 | * | 5/2004 | Chen | ................... G06F 11/2284 702/117 |
| 2004/0153902 A1 | * | 8/2004 | Machado | ............ G06F 11/1068 714/710 |
| 2005/0257179 A1 | * | 11/2005 | Stauffer | ................ G06F 30/327 716/102 |

(Continued)

*Primary Examiner* — Jigar P Patel

(74) *Attorney, Agent, or Firm* — Finnegan, Henderson, Farabow, Garrett & Dunner LLP

(57) ABSTRACT

A memory device includes an error code generator, one or more first pins coupled to an external data bus, and one or more second pins coupled to an external system interface. The one or more first pins output data chunks to the data bus during a period of memory operation; and the error code generator is configured to transmit a status code via the one or more second pins during the period of memory operation. The status code indicates at least one of an error was detected, an error was detected and corrected, or an error was detected and not corrected.

18 Claims, 10 Drawing Sheets

(56) References Cited

U.S. PATENT DOCUMENTS

| | | | |
|---|---|---|---|
| 2008/0082900 A1* | 4/2008 | Yoon | G11C 7/1006 |
| | | | 714/768 |
| 2008/0200206 A1* | 8/2008 | Mansson | G06F 9/4403 |
| | | | 455/556.1 |
| 2009/0037720 A1 | 2/2009 | Cho | |
| 2009/0049267 A1* | 2/2009 | Perner | G11C 7/20 |
| | | | 711/170 |
| 2009/0055695 A1* | 2/2009 | Maddali | G06F 11/27 |
| | | | 714/724 |
| 2014/0043715 A1* | 2/2014 | Cosgrave | H03G 1/0088 |
| | | | 361/90 |
| 2014/0281819 A1 | 9/2014 | Wood et al. | |

* cited by examiner

METHOD AND DEVICE FOR MONITORING DATA ERROR STATUS IN A MEMORY

CROSS-REFERENCE TO RELATED APPLICATIONS

This application is a continuation-in-part of U.S. application Ser. No. 14/596,768, filed Jan. 14, 2015, currently pending, which is based upon and claims the benefit of priority to U.S. Provisional Application No. 62/033,622, filed on Aug. 5, 2014. The disclosures of the above-referenced applications are incorporated herein by reference in their entireties.

TECHNOLOGY FIELD

The disclosure relates to operation of a memory and, more particularly, to a method and device for monitoring data error status in a memory device.

BACKGROUND

Data transmitted to or from a memory device may be lost or damaged. To mitigate or solve this problem, an error correcting code (ECC) can be added to a piece of data (also referred to as "user data" or "user code") written into a memory array of the memory device. The ECC can be generated by an ECC generator configured for the operation of the memory device. Usually, the user data and the corresponding ECC are stored in different portions of the memory array. The portion for storing user data is also referred to as a "normal array," while the portion for storing ECCs is also referred to as an "ECC array."

An ECC can be used to check whether corresponding user data contain any errors when the user data is read or transmitted from the memory device. If a correctable error exists, the ECC can also be used to correct the user data while the user data is being read or transmitted. Depending on the scheme adopted and the number of bits in the ECC, the ECC can correct a certain amount of fail bits in the corresponding user data. If the user data contain zero fail bits, the user data passes the check. If the number of fail bits in the user data is smaller than or equal to a maximum number of fail bits that the ECC can correct, the user data are correctable. But if the number of fail bits in the user data is larger than the maximum number, the user data are uncorrectable. For example, according to a Hamming code scheme, an ECC having eight ECC bits can be added to a chunk of user data containing 128 bits. Such an ECC allows one fail bit among the 128 bits to be corrected.

Conventionally, the error correction is performed inside the memory device. A user may not know whether a piece of output data initially contains no error or is later corrected. That is, the user does not receive and thus cannot check a data error status of data stored in the memory device.

SUMMARY

One aspect of the present disclosure is directed to a memory device. The memory device includes an error code generator, one or more first pins coupled to an external data bus, and one or more second pins coupled to an external system interface. The one or more first pins output data chunks to the data bus during a period of memory operation. The error code generator is configured to transmit a status code via the one or more second pins during the period of memory operation. The status code indicates at least one of: an error was detected, an error was detected and corrected, or an error was detected and not corrected.

Another aspect of the present disclosure is directed to a memory device, including one or more pins and at least one processor configured to perform operations. The operations include receiving a read status command, determining an error status code of the memory device upon receiving the read status command, and outputting the error status code through the one or more pins. The error status code is indicative of at least one of: an error was detected, an error was detected and corrected, an error was detected and not corrected, a number of fail bits, a number of fail data chunks, a location of fail bits, or a threshold voltage of a memory cell in the memory device storing fail bits.

Yet another aspect of the present disclosure is directed to a method for operating a memory device. The method includes outputting data chunks through one or more first pins coupled to an external data bus, determining a status code in response to receiving a status command, and outputting the status code through one or more second pins coupled to an external system interface while simultaneously outputting the data chunks. The status code indicates at least one of: an error was detected, an error was detected and corrected, or an error was detected and not corrected.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include method and device for processing commands for monitoring data error status in a memory device.

Hereinafter, embodiments consistent with the disclosure will be described with reference to the drawings. Wherever possible, the same reference numbers will be used throughout the drawings to refer to the same or like parts.

Figure 1:
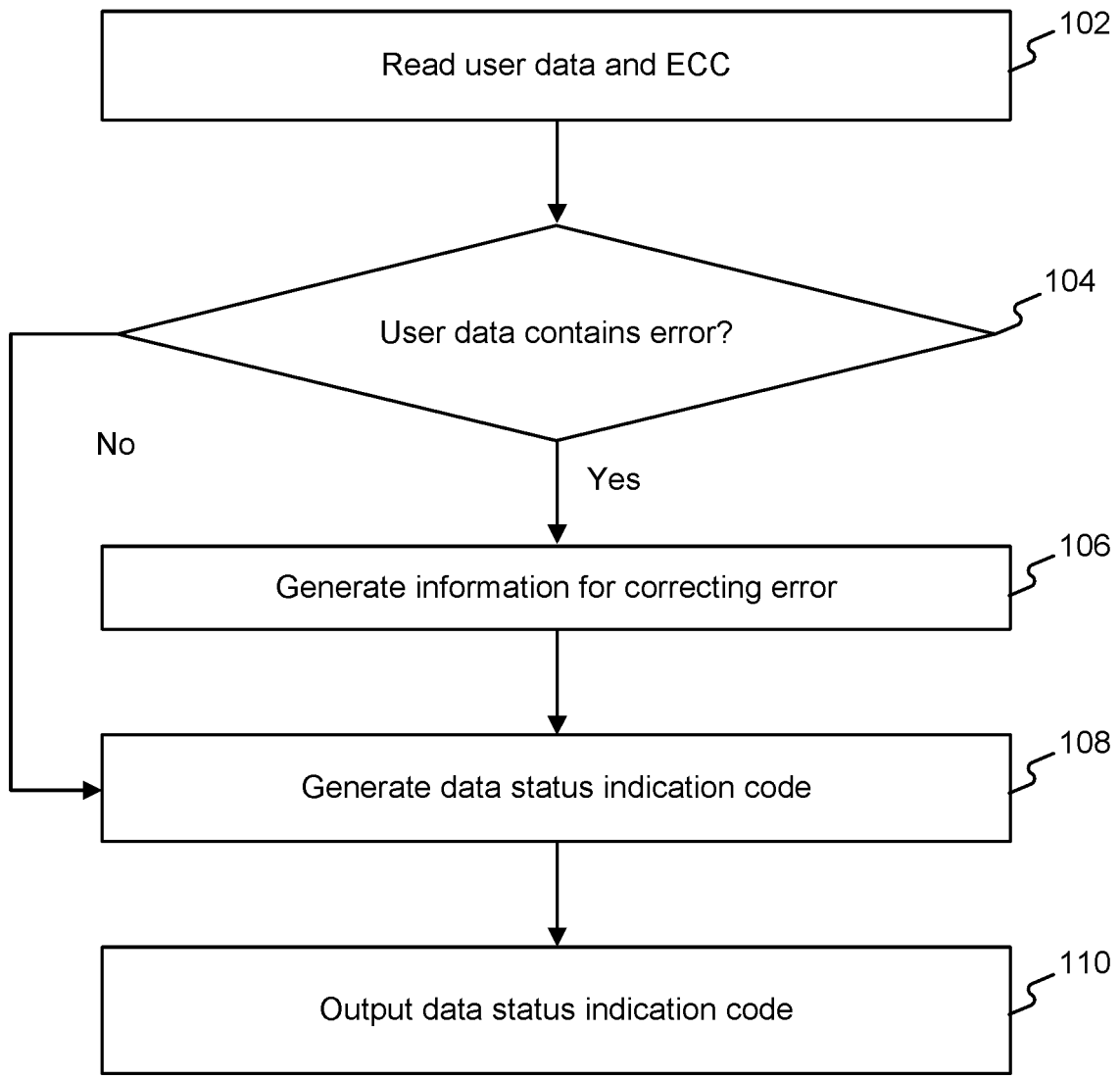
FIG. 1 is a flow chart showing a method for monitoring data error status in a memory device according to an exemplary embodiment.

FIG. 1 is a flow chart showing an exemplary method 100 for monitoring data error status in a memory device. The memory device includes a memory array storing user data and corresponding error correction codes (ECCs). The memory array includes a plurality of memory cells, each of which may store one or more data bits. In some embodiments, the user data and corresponding error correction codes are stored in different portions of the memory array. The portion for storing the user data is also referred to as a normal array and the portion for storing the ECCs is also referred to as an ECC array. In some embodiments, the memory device may also include a memory controller to control its operation.

As shown in FIG. 1, at 102, the memory device reads a piece of user data from the normal array and a corresponding ECC from the ECC array. Such a piece of user data is also referred to as a "data chunk." The data chunk may include, for example, 128 bits of user data. The corresponding ECC may include, for example, eight bits.

At 104, the memory device checks whether the data chunk contains any error by referring to the ECC. If so, the memory device performs a calculation to generate information for correcting such error (106 in FIG. 1). Such information may include, for example, fail bit address information, which indicates a position of a fail bit in the chunk or an address of the fail bit in the memory array.

After the information for correcting the error is calculated at 106 or if the data chunk does not contain any error as determined at 104, the memory device generates a data status indication code indicating error status of the data chunk (108 in FIG. 1). The data status indication code may indicate at least one of a fail bit number, a fail bit location, or a fail bit threshold voltage. Consistent with the disclosure, "fail bit number" refers to the number of fail bits in the data chunk, "fail bit location" refers to a location of a fail bit in the data chunk, and "fail bit threshold voltage" refers to a threshold voltage of a memory cell that stores a fail bit.

In some embodiments, the data status indication code includes two bits. For example, a code of "00" indicates that the data chunk read from the normal array does not contain any error ("Pass"); a code of "01" indicates that the data chunk read from the normal array contains an error but the error can be corrected ("Correctable"), and the memory device corrects the error and outputs a corrected data chunk; and a code of "10" indicates that the data chunk read from the normal array contains an error that cannot be corrected ("Uncorrectable").

At 110, the memory device outputs the data status indication code to a system interface, such that a host system receives information about the data error of the data chunk. In some embodiments, the system interface may be coupled to a host system that applies and/or uses the memory device. For example, the system interface may couple memory devices with motherboards, databases, or other computer components using data storage of the memory device. In such embodiments, the system interface may include a CPU/Memory interface, an advanced interconnect, high-performance memory interface (such as a DDR, QDR, RLDRAM, FCRAM), or external memory interfaces of processors (e.g., DRAM, SRAM, or TCAM interfaces). Alternatively, or additionally, the system interface may, for example, be an interface displayed on a screen.

Figure 2:
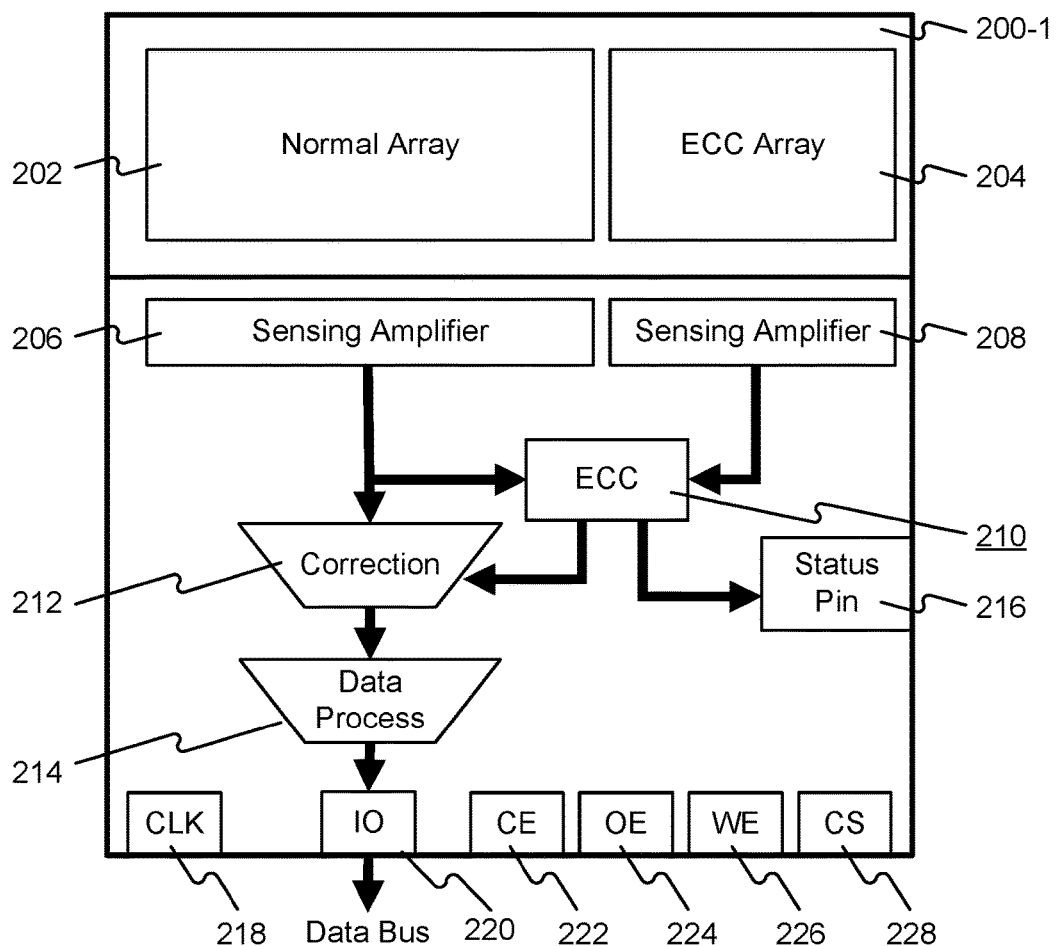
FIG. 2 is a block diagram schematically showing a structure of a memory device according to an exemplary embodiment.

FIG. 2 is a block diagram schematically showing a structure of a memory device 200 consistent with embodiments of the disclosure. Memory device 200 includes a memory array 200-1 configured to save data. Memory device 200 may be configurable to perform operations such as, for example, reading data from and writing data to the memory array 200-1, and outputting data to outside of the memory device 200, such as to a data bus pin.

As shown in FIG. 2, the memory array 200-1 includes a normal array 202 storing user data and an ECC array 204 storing ECCs.

Memory device 200 includes a first sensing amplifier 206, a second sensing amplifier 208, an error status decoding circuit 210 (labeled as "ECC" in the figure), a correction circuit 212 (labeled as "Correction" in the figure), a data processing circuit 214 (labeled as "Data Process" in the figure), and a status pin 216. Consistent with the disclosure, the correction circuit 212 and the data processing circuit 214 may each include, for example, a multiplexer. The first sensing amplifier 206 interacts with the normal array 202 to, for example, read the user data from the normal array 202. The second sensing amplifier 208 interacts with the ECC array 204 to, for example, read the ECCs from the ECC array 204. The first sensing amplifier 206 outputs the acquired user data to the correction circuit 212. Further, the first and second sensing amplifiers 206 and 208 respectively output the acquired user data and ECCs to the error status decoding circuit 210, which checks whether the user data contain any error and, if so, generates information for correcting such error. The error status decoding circuit 210 then outputs this correction information to the correction circuit 212, which uses the correction information to correct the user data received from the first sensing amplifier 206. The corrected user data is then output to the data processing circuit 214 for outputting to, for example, a data bus pin. If the user data read from the normal array 202 by the first sensing amplifier 206 do not contain any error, they are then passed by the correction circuit 212 to the data processing circuit 214 for outputting, and no correction is performed.

Consistent with embodiments of the disclosure, the error status decoding circuit 210 also generates a data status indication code indicating the error status of the corresponding data read from the normal array 202, and outputs the data status indication code to the status pin 216. The status pin 216 then outputs the data status indication code to a system interface for communicating with the host system.

Further, some embodiments of memory device 200 may include additional pins for memory operation. As shown in FIG. 2, memory device 200 may include one or more clock pins 218, input/output (I/O) pins 220, chip enable (CE) pins 222, output enable (OE) pins 224, write enable (WE) pins 226, and chip select (CS) pins 228.

Clock pins 218 may include one or more pins and may be configurable to receive and/or transmit clock signals to or from other devices. For example, clock pins 218 may be coupled to an oscillator, such as a crystal oscillator or a timer circuit. In some embodiments, memory device 200 may include an internal clock connected to clock pins 218. In other embodiments, clock pins 218 may be coupled to circuitry to receive and operate based on clock signals received through clock pins 218.

I/O pins 220 may include one or more pins and may be configurable to receive commands, transmit commands, receive information to be stored (for example in normal array 202), or transmit data chunks read from arrays in the memory device. As shown in FIG. 2, I/O pins 220 may be coupled to data processing circuit 214. However, in other embodiments, I/O pins 220 may we directly coupled to other elements of memory device 200. For example, I/O pins 220 may be coupled to memory arrays, multiplexers, or processors. Moreover, I/O pins 220 may couple memory device 200 with a data bus. As shown in FIG. 2, I/O pins 220 may interface data processing circuit 214 with a data bus. In such embodiments, I/O pins 220 may be configured to connect with one or more data buses. For example, I/O pins 220 may be configured to connect with a motherboard or to be connected with external elements that exchange information with memory device 200.

CE pins 222 may include one or more pins and may be configurable to receive chip enabling signals. Memory device 200 may include circuitry that enable or disable operations of memory device 200. For example, memory device 200 may include circuitry that couples or decouples elements of memory device 200 from power sources to enable or disable memory device 200. In such embodiments, CE pins 222 may be configurable to receive signals that enable or disable the device. For instance, CE pins 222 may receive signals to turn on switching devices that connect memory device 200 to a power source and enable the device. Further, CE pins 222 may be configured to activate (or deactivate) components that enable the operation of memory device 200. For example, CE pins 222 may be coupled to transistors or amplifiers that enable or disable the operation of memory device 200.

OE pins 224 may include one or more pins and may be configurable to receive signals that enable outputting data from memory device 200. For example, OE pins 224 may receive signals that enable memory device 200 to output data chunks and or status indication codes. In some embodiments, OE pins 224 may receive signals that trigger actuators (such as transistors or flip-flops) that establish connections between elements of memory device 200 to allow information outputs. For example, OE pins 224 may receive signals that trigger the actuators that connect data processing circuit 214 with I/O pins 220. In such embodiments, OE pins 224 may be coupled to initiate operation of switching devices that connect, or disconnect, elements of memory device 200. Alternatively, or additionally, OE pins 224 may receive signals that trigger connections between sensing amplifier 206 and normal array 202, to enable output of data chunks, or between ECC 210 and status pin 216, to enable output of status indication codes.

WE pins 226 may include one or more pins and may be configurable to receive signals that enable writing in memory device 200. WE pins 226 may receive signals that instruct memory device 200 to enable changes in arrays of memory device 200. For example, when receiving a high signal on WE pins 226, circuitry in memory device 200 may enable changes in normal array 202. In such embodiments, WE pins 226 may be coupled to normal array 202 and configure normal array 202 to perform changes in the array. Alternatively, or additionally, WE pins 226 may be coupled to flip-flop or latches that cause data on I/O pins 220 to be written into the address cell(s) of normal array 202. Further, in embodiments where WE pins 226 include two or more pins, WE pins 226 may be coupled to processors in memory device 200 that identify writing modes. Further, WE pins 226 may be configured to receive signals that enable modifications of ECC 210. As further described below in connection with FIG. 9, in some embodiments ECC 210 may be configurable or programmed to output customized codes defined by a user. In such embodiments, WE pins 226 may enable such modifications of ECC 210.

CS pins 228 may include one or more pins and may be configurable to receive signals that select memory device 200. In embodiments where memory device 200 is coupled to a data bus that uses chip/slave select configurations, CS pins 228 may receive a signal indicating memory device 200 has access to the data bus. In some embodiments, CS pins 228 may be coupled to circuitry in memory device 200 to couple memory device 200 with a data bus. For example, CS pins 228 may be coupled to switching devices in memory device 200 to connect I/O pins 220 with data processing circuit 214. Then, when memory device 200 is selected (i.e., receives a signal on CS pins 228), memory device 200 gains access to the data bus, to receive or transmit information to external elements, such as a system interface. In some embodiments, when CS pins 228 is held in the inactive state, memory device 200 is disconnected and does not carry out changes in the state of its other input pins. For example, memory device 200 may enter a sleep mode and hold outputs in a high impedance state, allowing external devices to drive those signals. When CS pins 228 are held in the active state, memory device 200 may consider that any input changes received are addressed to memory device 200, reduce output impedance, and respond as if it is the only device connected to the data bus. Because other devices coupled to the data bus may have respective CS pins in an inactive state, the other devices may output high impedance, allowing memory device 200 to drive its outputs. Accordingly, operation of CS pins 228 may be configured as part of power consumption cycles and be programmed to minimize memory consumption.

Memory devices consistent with embodiments of the disclosure, such as the memory device 200 shown in FIG. 2, may include, for example, parallel flash memories and serial flash memories. Based on the type of memory, the configuration of pins in memory device 200 may change. Although FIG. 2 shows memory device 200 including each of one or more clock pins 218, I/O pins 220, CE pins 222, OE pins 224, WE pins 226, and CS pins 228, other embodiments (not shown) may only include one or a selected group of this pins. For example, memory device 200 may be a parallel flash memory device. In such embodiments, memory device 200 may include CE pins 222, WE pins 226, CE pins 222, OE pins 224, and at least eight I/O pins 220, but not include clock pins 218 or CS pins 228. Alternatively, memory device 200 may be a serial flash memory device. In such embodiments, memory device 200 may include CS pins 228, clock pins 218 and include a single pin for I/O pins 220, but not include CE pins 222, WE pins 226, or OE pins 224. Other embodiments are also possible in which memory device 200 includes different combinations of the pins shown in FIG. 2. For example, memory device may include CS pins 228, clock pins 218, and OE pins 224, excluding the remaining pins, but other combinations may include clock pins and at least eight I/O pins 220.

Figure 3:
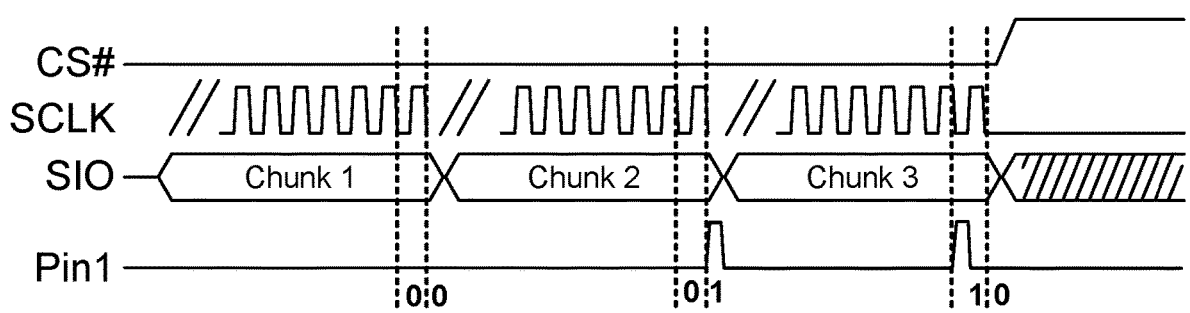
FIG. 3 schematically shows signal wave forms when outputting data error status according to an exemplary embodiment.

FIG. 3 schematically shows signal wave forms for an exemplary serial flash memory consistent with embodiments of the disclosure. In FIG. 3, CS# stands for "Chip Enable", which controls when the memory is enabled (operation on the memory can be performed when the memory is enabled); SIO stands for "Serial Input/Output," which represents the data output by the memory to, for example, the data bus pin; and SCLK stands for "Serial Clock." Further, in FIG. 3, "Pin1" represents a signal output by the status pin 216.

As shown in FIG. 3, one data chunk is output during a plurality of clock cycles of SCLK. A period of such a plurality of clock cycles may be referred to as an ECC correctable data period. In the example shown in FIG. 3, the data status indication code includes two bits. The two bits are output by the same status pin 216 at two clock cycles of the ECC correctable data period of the corresponding data chunk. In the example shown in FIG. 3, the two bits are sequentially output at the last two clock cycles of the ECC correctable data period. In some embodiments, the two bits may be output at other clock cycles of the ECC correctable data period. Moreover, in the example shown in FIG. 3, each of the two bits of the data status indication code is output during one clock cycle. In some embodiments, each of the two bits may be output during more than one clock cycle.

Figure 4:
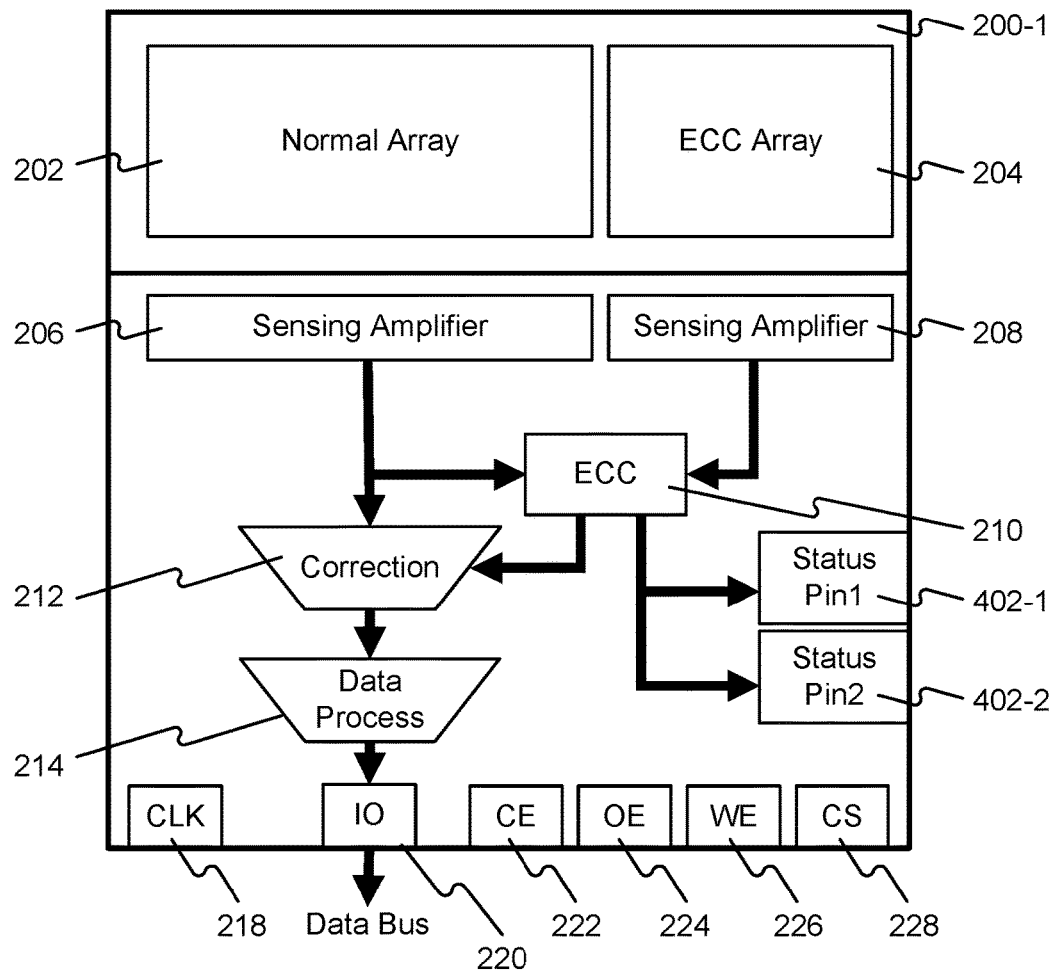
FIG. 4 is a block diagram schematically showing a structure of a memory device according to another exemplary embodiment.

Consistent with embodiments of the disclosure, a memory device may have more than one status pins for outputting a data status indication code that includes more than one bit. FIG. 4 is a block diagram schematically showing a structure of a memory device 400 consistent with embodiments of the disclosure. The memory device 400 is similar to the memory device 200, except that the memory device 400 includes two status pins 402-1 and 402-2, each of which outputs one of two bits of a data status indication code. In other embodiments, not shown, memory device 400 may include multiple status pins 402. For example, in some embodiments memory device 400 may include status pins 402-1 to 402-8 for outputting data status indication code of one byte. Alternatively, memory device 400 may include a different number of pins. For example, memory device 400 may include status pins 402-1 to 402-16, for outputting data status indication code of one word, or may include status pins 402-1 to 402-64, for outputting data status indication code of one quadword. Embodiments with multiple status pins 402 may be configurable to generate status codes that include error location and/or a threshold of a cell voltage. With multiple pins, memory device 400 may transmit information of voltages and locations with the status codes.

Further, in additional embodiments, as shown in FIG. 4 and like memory device 200 (FIG. 2), memory device 400 may further include additional pins for communication, including one or more clock pins 218, I/O pins 220, CE pins 222, OE pins 224, WE pins 226, and CS pins 228. As described in connection with FIG. 2, memory device 400 may include one or a selected group of these pins. For example, when memory device 400 is a parallel flash memory, memory device 400 may include only CE pins 222, WE pins 226, OE pins 224, and at least eight I/O pins 220 (excluding clock pins 218 and CS pins 228). However, if memory device 400 is a serial flash memory, memory device 400 may only include CS pins 228, clock pins 218, and a single pin for I/O pins 220. Other embodiments, however, may include all of the pins or different groups.

Figure 5:
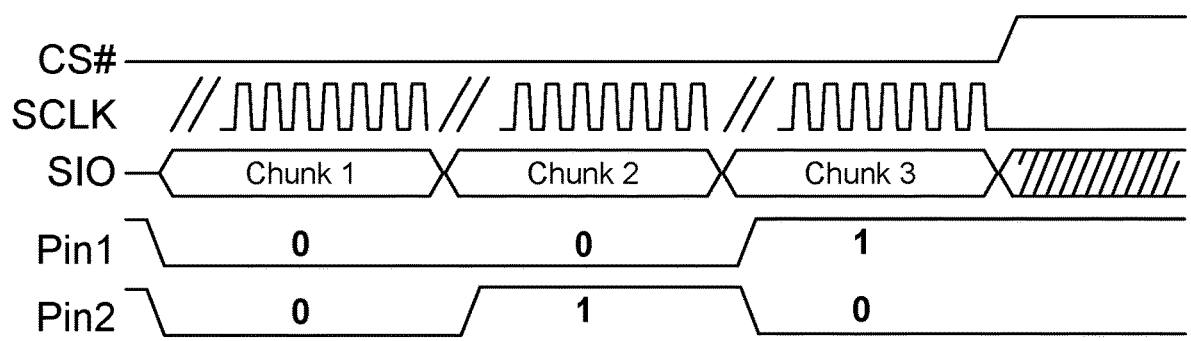
FIG. 5 schematically shows signal wave forms when outputting data error status according to another exemplary embodiment.

FIG. 5 schematically shows signal wave forms for an exemplary serial flash memory having two status pins consistent with embodiments of the disclosure. In FIG. 5, "Pin1" and "Pin2" represent the signals output by the status pins 402-1 and 402-2, respectively. Similar to the wave form shown in FIG. 3, in FIG. 5, one data chunk is output during one ECC correctable data period. The two bits of the data status indication code are simultaneously output by the different status pins 402-1 and 402-2, respectively, during the entire ECC correctable data period of the corresponding data chunk. In some embodiments, the two bits may be output by the status pins 402-1 and 402-2 during a portion of the ECC correctable data period.

Figure 6:
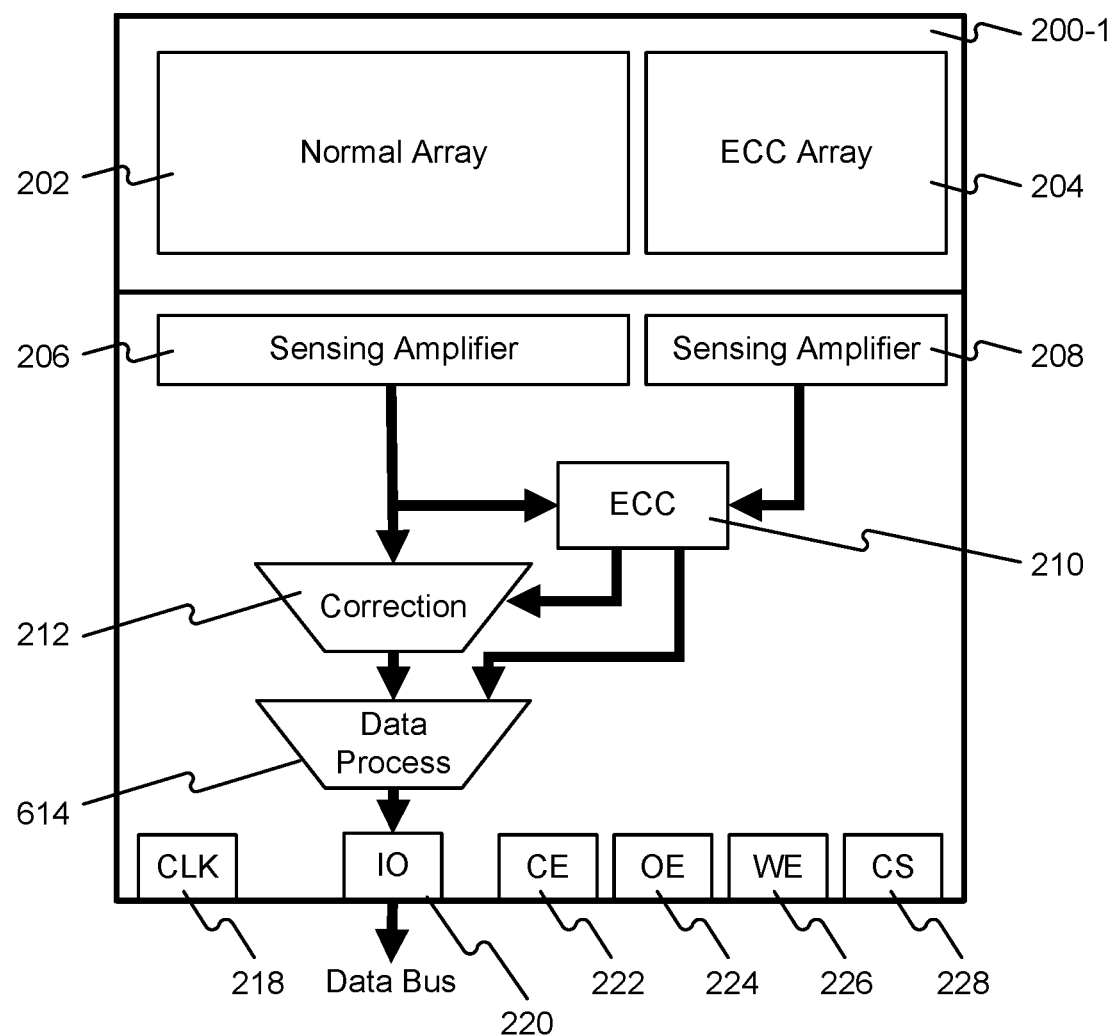
FIG. 6 is a block diagram schematically showing a structure of a memory device according to a further exemplary embodiment.

In the examples discussed above, a memory device consistent with embodiments of the disclosure outputs the data status indication code through at least one status pin. In some embodiments, a memory device does not need to include a status pin but can output the data status indication code along with the user data. FIG. 6 is a block diagram schematically showing a structure of a memory device 600 consistent with embodiments of the disclosure. The memory device 600 differs from the memory devices 200 and 400 in that memory device 60 does not have a specifically assigned status pin for outputting the data status indication code. Instead, the error status decoding circuit 210 in the memory device 600 outputs the data status indication code to a data processing circuit 614, which combines the data status indication code with the corresponding data chunk to generate an output signal and outputs the output signal to a data bus pin. Consistent with embodiments of the disclosure, the data status indication code can be added after the data chunk. Therefore, a serial flash memory consistent with embodiments of the disclosure outputs the data status indication code after outputting the data chunk.

Further, in additional embodiments, as shown in FIG. 6 and similar to memory device 200 (FIG. 2) or memory device 400 (FIG. 2), memory device 600 may also include additional pins for communication, including clock pins 218, I/O pins 220, CE pins 222, OE pins 224, WE pins 226, and CS pins 228. As described in connection with FIG. 2, memory device 400 may include one or a selected group of these pins. For example, when memory device 600 is a parallel flash memory, memory device 600 may include only CE pins 222, WE pins 226, OE pins 224, and at least eight I/O pins 220 (excluding clock pins 218 or CS pins 228). However, if memory device 600 is a serial flash memory, memory device 600 may only include CS pins 228, clock pins 218, and a single pin for I/O pins 220. Other embodiments, however, may include all of the pins or different groups.

Figure 7A:
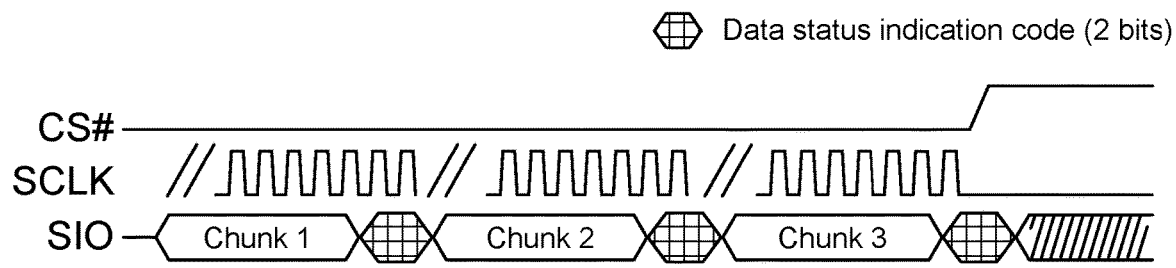
FIGS. 7A and 7B schematically show signal wave forms when outputting data error statuses according to further exemplary embodiments.

FIG. 7A schematically shows signal wave forms for an exemplary serial flash memory without status pins consistent with embodiments of the disclosure. In FIG. 7A, a data status indication code and its corresponding data chunk are output through the same pin, but during different clock cycles. The period of a plurality of clock cycles during which the data status indication code and its corresponding data chunk are output is also referred to as an output period. In the example shown in FIG. 7A, each data status indication code includes two bits, one of which is output at the next-to-last clock cycle of the output period and the other one of which is output at the last clock cycle of the output period.

Figure 7B:
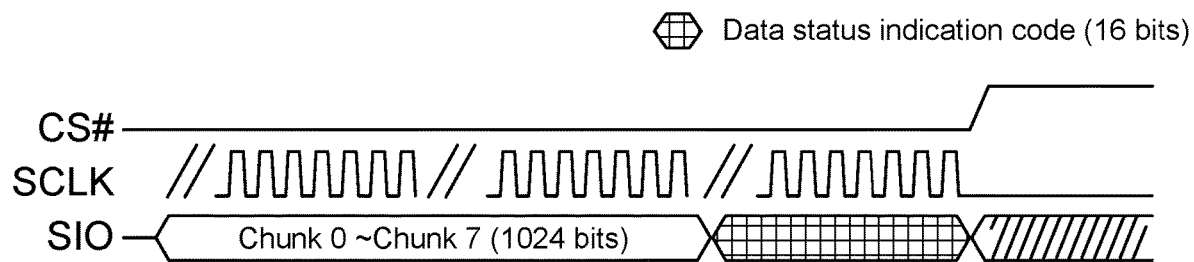

Data status indication codes and their respective corresponding data chunks do not have to be output in the fashion shown in FIG. 7A. FIG. 7B shows another exemplary outputting manner according to some embodiments of the disclosure. In the example shown in FIG. 7B, a data status indication code is not output immediately following its corresponding data chunk. Instead, eight data status indication codes are output together after their corresponding data chunks are output.

In the examples discussed above, a memory device automatically outputs a data status indication code when outputting its corresponding data chunk. However, the outputting of a data status indication code can be performed if needed. That is, in some embodiments, the memory device can provide the data status indication code in response to a user command. The user command can be entered by the user when he/she wishes to know the error status of a certain data chunk. In some embodiments, the user command can be transmitted to the memory device through the data bus pin. Such a method can be implemented by any memory device consistent with embodiments of the disclosure, such as the memory device 200 shown in FIG. 2, the memory device 400 shown in FIG. 4, or the memory device 600 shown in FIG. 6.

In some embodiments, the memory device generates a plurality of data status indication codes, each of which corresponds to one of a plurality of data chunks being transmitted by the memory device. When the memory device receives the user command, it outputs one or more of the data status indication codes, according to the instructions in the user command. In some embodiments, the memory device does not generate any data status indication code until it receives the user command.

In some embodiments, the data chunks are transmitted sequentially, and the user command instructs the memory device to output the data status indication code corresponding to the last one of the data chunks. In some embodiments, the user command can instruct the memory device to output the data status indication code corresponding to a certain one of the data chunks, or data status indication codes corresponding to certain ones of the data chunks. For a memory device having at least one status pin, such as that shown in FIG. 2 or 4, the data status indication code is output through the at least one status pin. For a memory device without status pins, such as that shown in FIG. 6, the data status indication code is output by the data processing circuit to a data bus pin that is used to output the data chunks.

Figure 8:
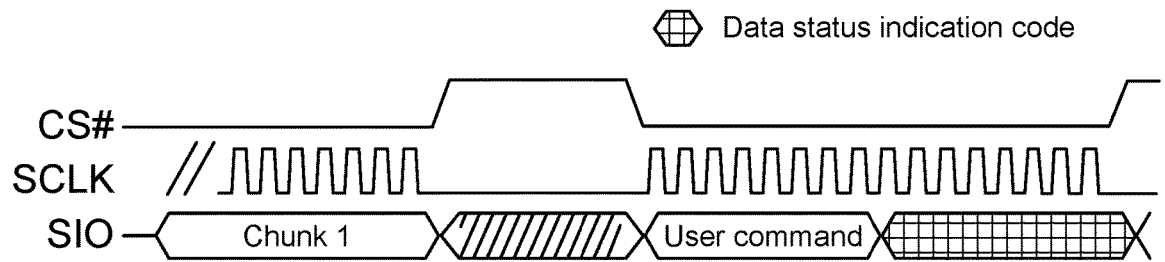
FIG. 8 schematically shows signal wave forms when outputting data error status according to another exemplary embodiment.

FIG. 8 schematically shows signal wave forms for an exemplary serial flash memory without status pins consistent with embodiments of the disclosure when outputting one or more data status indication codes after a user command is received.

Figure 9:
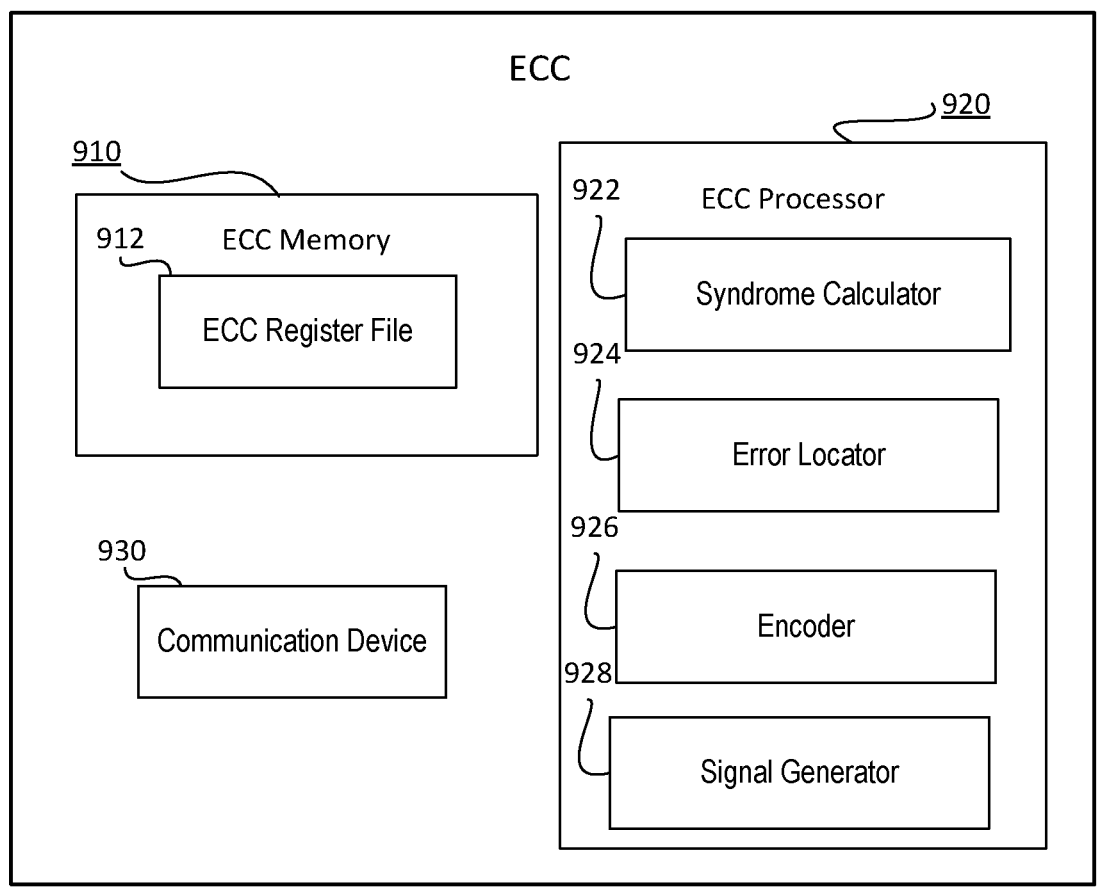
FIG. 9 is a block diagram schematically showing a structure of an error status decoding circuit according to an exemplary embodiment.

FIG. 9 is a block diagram schematically showing a structure of error status decoding circuit (ECC) 210 according to an exemplary embodiment. As shown in FIG. 9, ECC 210 includes an ECC memory 910, an ECC processor 920, and a communication device 930.

ECC memory 910 may include memory devices that store instructions for ECC 210 operation. For example, ECC memory 910 may store instructions for ECC processor 920 to detect and correct data corruption. Further ECC memory 910 may include redundancy information to correct bit errors and support scrubbing of memory content. Further, as shown in FIG. 9, ECC memory 910 includes an ECC register file 912, which may include standard error codes that should be outputted based on detection and correction operations—further described in connection with FIGS. 11-12. In some embodiments, ECC register file 912 may provide a plurality of registers designating words and bytes to compare data chunks and identify errors.

In some embodiments, ECC memory 910 may be programmed or configured for different error types or to output different information. For example, ECC memory 910 may be configurable via I/O pins 220 to switch the type of information to be transmitted from memory devices after receiving specific commands. In such embodiments, ECC memory 910 may be programmed so ECC 210 performs specific customizable operations configured via, for example, a system interface. For example, ECC 210 may be programmable so status indication codes outputted via status pin 216 are configurable for memory device 200. In such embodiments, memory device 200 may be configurable to switch the type of information to be output after accepting a specified command.

Moreover, ECC memory 910 may accumulate errors. For example, errors in data chunks stored in normal array 202 (FIG. 2) may be accumulated in ECC memory 910. In such embodiments, ECC 210 may be configurable to send accumulated codes for a period of time, generating a code of whether any error has occurred after a triggering event. For instance, ECC memory 910 may accumulate errors since last power-up of the memory and accumulate detected errors in ECC memory 910 to then transmit an accumulated error code.

In some embodiments, ECC memory 910 may be coupled with ECC array 204 (FIG. 2). In such embodiments, ECC memory 910 may also store ECC codes.

ECC processor 920 may include logic circuitry to execute operations of ECC 210, process data, generate ECC codes, and/or output ECC codes via, for example, communication device 930. ECC processor 920 includes a syndrome calculator 922, an error locator 924, an encoder 926, and a signal generator 928.

Syndrome calculator 922 may include software or hardware for syndrome calculation and to detect errors. In some embodiments, ECC 210 may perform operations to generate syndrome polynomials for correcting errors and/or erasures in data. Syndrome calculator 922 may decode linear data by using a reduced lookup table. Further, syndrome calculator 922 may form a class of cyclic error-correcting codes that are constructed using polynomials to identify errors. In some embodiments, syndrome calculator 922 may employ binary codes to correct multiple bit errors.

Error locator 924 may include software or hardware for detection of error locations in data chunks or in the memory device. Error locator 924 may be configured to count the number of failed bits in the results read by, for example, sensing amplifier 206 (FIG. 2). Error locator 924 may also identify fail bits that have been inadequately programmed in cells and that have inadequate threshold voltages. Error locator 924 may be configured to forward location and number of failed bits over the entire sensed data to other elements of ECC processor 920, such as encoder 926 or signal generator 928. Further, error locator 924 may perform iterative analysis until the data analyzed from the memory is sufficiently tested. In some embodiments, during detection operation, error locator may perform correction operations concurrently. Error locator 924 may correct detected fail bits as data is being scanned or until a selected maximum number of programming loops have been performed. In such embodiments, error locator 924 may mark data chunks as unusable or uncorrectable when error locator 924 determines the error cannot be corrected.

Encoder 926 may include software or hardware to generate a code, such as the status code outputted via status pin 216 (FIG. 2). Encoder 926 may generate codes depending on the errors identified by, for example, error locator 924 and syndrome calculator 922. In some embodiments, encoder 926 may generate codes to be outputted using status pin 216, status pins 402, and/or I/O pins 220. For example, encoder 926 may generate a byte encoding information of the error detected and whether the error was corrected. In such embodiments, encoder 926 may generate codes indicating that: (1) an error was detected, (2) an error was detected and corrected, (3) an error was detected and not corrected, (4) a number of fail bits, (5) a number of fail data chunks, (6) a location of fail bits; or (7) a threshold voltage of a memory cell in the memory device storing fail bits. Alternatively, or additionally, encoder 926 may generate accumulation codes to encode errors that have been accumulated for a period of time. Further, encoder 926 may encode output messages using a narrow-sense generator polynomial. In some embodiments, encoder 926 may perform operations to generate data status indication codes as described at 108 in FIG. 1.

Signal generator 928 may be hardware or software configured to generate signals for transmitting ECC codes. Signal generator 928 may generate signals to transmit outputs and/or enable switching devices. For example, signal generator 928 may be coupled to status pin 216 (FIG. 2) and generate signals according to codes generated by encoder 926. Further, signal generator 928 may be coupled to one or more buffers or switching devices to output data status indication codes. For example, as further described in connection with FIGS. 10A-10B signal generator 928 may be coupled to switching devices that enable output of status codes.

While in some embodiments ECC 210 may communicate by directly using ECC processor 920, for example via signal generator 928, in other embodiments ECC 210 may receive and send information using communication device 930. Communication device 930 may be configured to communicate with one or more elements of memory devices. For example, communication device 930 may enable communication of ECC 210 with sensing amplifiers 206 and 208. Communication device 930 may include, for example, one or more digital and/or analog devices that allow communication device 930 to communicate with and/or detect other components, such as correction circuit 212. Other implementations consistent with disclosed embodiments are possible as well.

Figure 10A:
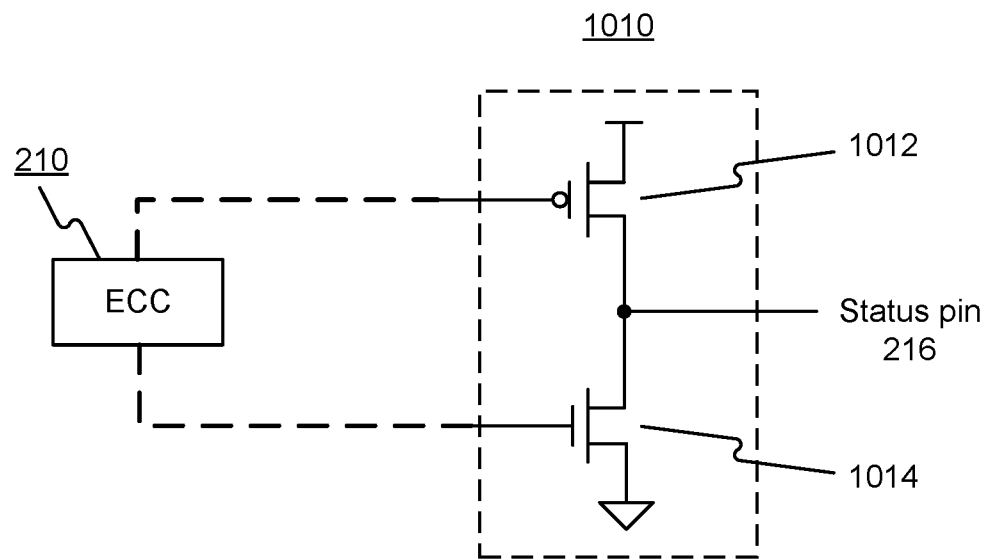
FIG. 10A schematically shows a first output buffer pin configuration according to an exemplary embodiment.

FIG. 10A schematically shows a first output buffer pin configuration 1010 according to an exemplary embodiment. FIG. 10A shows an embodiment in which status pin 216 is configured with a complementary output buffer. The same configuration may be employed for each one of the status pins when more than one status pin is provided. For example, each one of the status pins 402 may be coupled to a complementary output buffer configuration as shown in FIG. 10A.

As shown in FIG. 10A, first output buffer configuration 1010 includes a PMOS device 1012 and an NMOS device 1014 connected in series. The status pin—status pin 216 or one or more of status pins 402—may be connected to a common node between PMOS device 1012 and NMOS device 1014. As shown in FIG. 10A, status pins may be connected to the drain/source connection between PMOS device 1012 and NMOS device 1014. Moreover, the gate nodes of the PMOS device 1012 and NMOS device 1014 may be coupled to ECC 210. For example, PMOS device 1012 and NMOS device 1014 may be controlled by ECC 210, allowing ECC 210 to switch PMOS device 1012 or NMOS device. In such embodiments, gates of PMOS device 1012 and NMOS device 1014 may be coupled with, for example, signal generator 928 or communication device 930 (FIG. 9).

As shown in FIG. 10A, with the configuration of first output buffer 1010, a "0" code may be outputted through status pin 216 by turning on NMOS device 1014 to drive status pin 216 to a voltage low state. In contrast, a "1" code is output through status pin 216 by turning on PMOS device 1012 to drive status pin 216 to a voltage high state. Status pins 402 (FIG. 4) may be similarly configured with the first output buffer configuration 1010. In some embodiments, outputting "1" means an error occurred and "0" means no error. Alternatively, in other embodiments, "0" means an error occurred and "1" means no error. In embodiments, with multiple status pins, as in memory device 400, or where the status code is transmitted with a sequence of bits based on encoder 926, PMOS device 1012 and NMOS device 1014 may be turned on and off as required to transmit the desired status code.

Figure 10B:
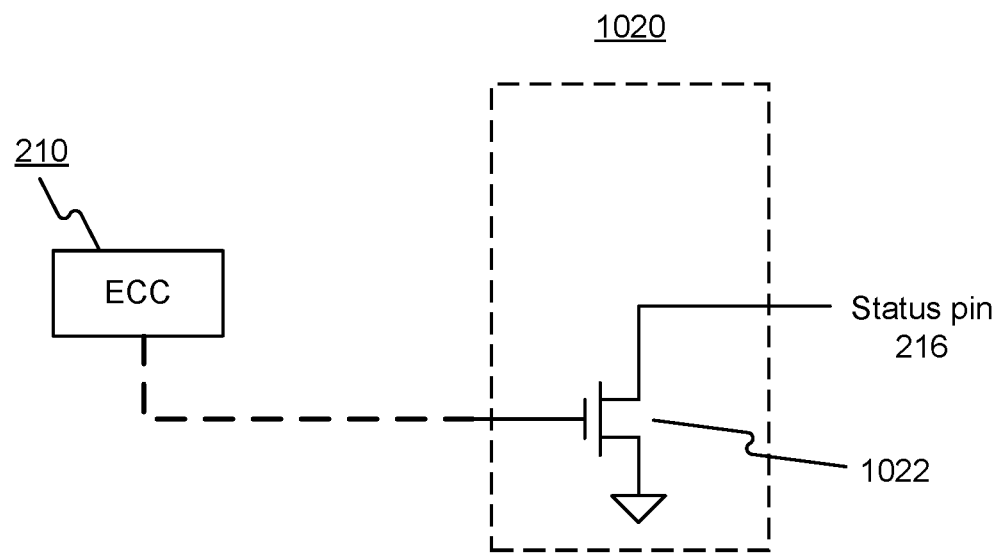
FIG. 10B schematically shows a second output buffer pin configuration according to another exemplary embodiment.

FIG. 10B schematically shows a second output buffer pin configuration 1020 according to another exemplary embodiment. The same configuration may be employed for each one of the status pins. For example, each one of the status pins 402 may be coupled to complementary output buffer configurations as shown in FIG. 10B.

FIG. 10B shows the second output buffer configuration 1020 includes an NMOS device 1022 having a first drain/source node connected to ground, a second drain/source node connected to status pin 216, and a gate node coupled to ECC 210. In such embodiments, ECC 210 may control the operation of NMOS device 1022 and turn on or off the device. For example, the gate of NMOS device 1022 may be coupled with signal generator 928 or communication device 930 (FIG. 9).

As shown in FIG. 10B, with configuration 1020 a "0" code is output by turning on NMOS device 1022 to a low state. Instead a "1" code is output by turning off NMOS device 1022. In some embodiments, outputting "0" means an error occurred while "1" means no error. In other embodiments, the codification of signals may be inverse, with "0" as no error and "1" as error. Moreover, in embodiments where the memory device includes multiple status pins, or error status is transmitted in a sequence of bits, NMOS devices 1022 may be configured accordingly to generate the encoded signals.

Configuration 1020 may be particularly advantageous when memory devices are placed in a system coupling multiple memory devices. With configuration 1020 the status pins of each one of the memory devices in the system may be directly wire-connected together with shared weak pull-high-on system. For example, configuration 1020 allows connecting multiple memory devices to a status bus in parallel, where each memory device is directly wire-connected to the status bus. Further, the multiple memory devices may be configured to generate status codes of error by outputting a "0" status code. In such embodiments, if the wire-connected status of the memory becomes "1," this would indicate that the memories are working correctly because none of them has any error. However, if the wire-connected becomes "0," any of the coupled memory devices may be outputting a "0," signaling that at least one of the memory devices is defective. Coupling the status pins using configuration 1020 allows the evaluation of the memories as a group, without requiring individualized queries. Thus, configuration 1020 may be advantageous in complex systems with multiple memory devices or where the system interface controls many devices.

Figure 11:
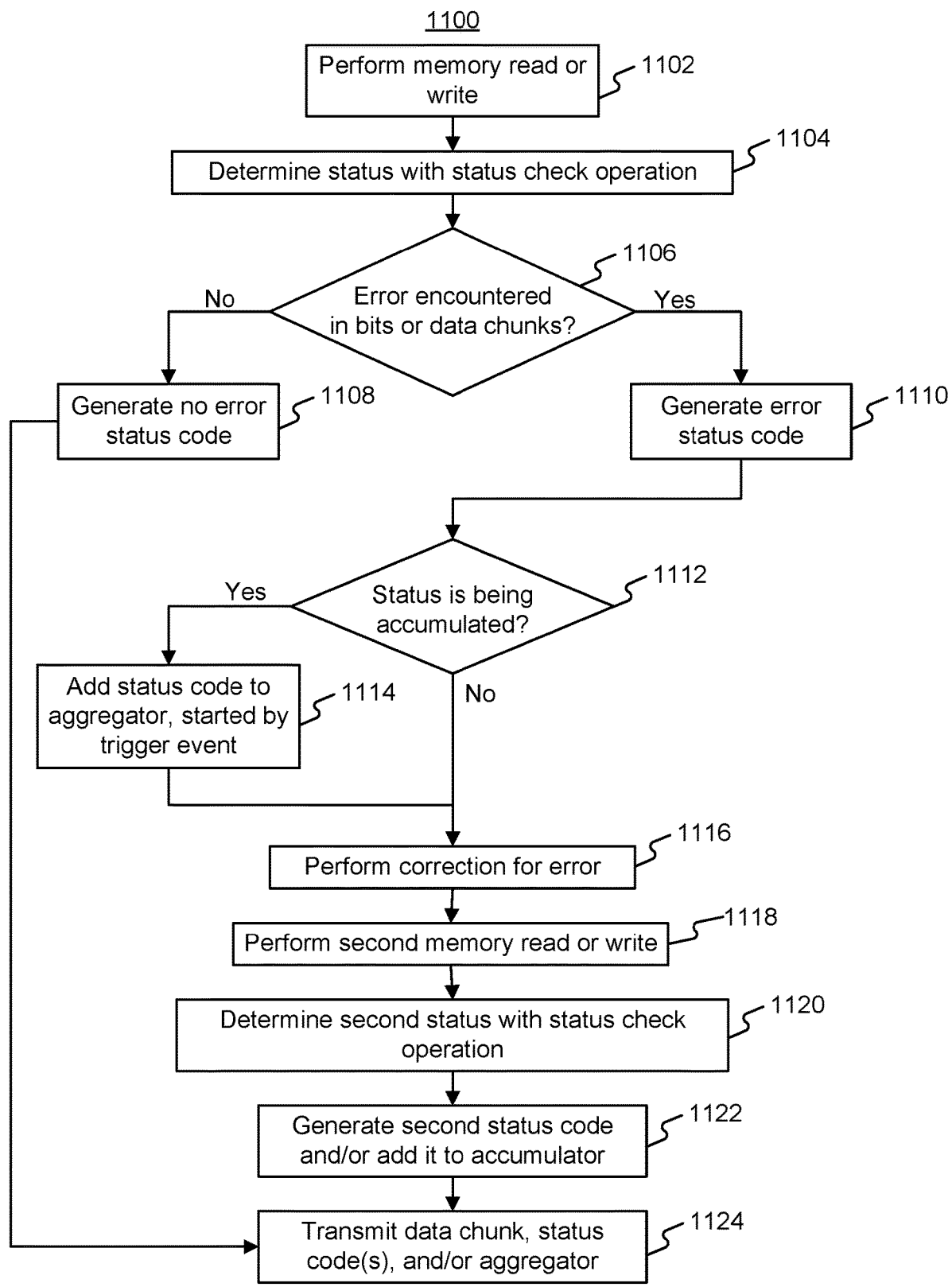
FIG. 11 is a flow chart showing a method for performing reading or writing operations in a memory device according to an exemplary embodiment.

FIG. 11 is a flow chart showing a method 1100 for performing reading or writing operations in a memory device according to an exemplary embodiment. Method 1100 may be performed by one or more elements of memory devices 200, 400, or 600. For example, method 1100 may be performed by ECC 210 in combination with data processing circuit 214 and correction circuit 212. In other embodiments, however, method 1100 may be performed by dedicated elements in the memory device. For example, method 1100 may be performed by a memory controller in the memory device.

The description of method 1100 below uses memory device 200 as an exemplary element performing method 1100. However, other memory devices (e.g., memory device 400 or memory device 600) or specific elements of the memory devices (e.g., ECC 210) may perform method 1100.

In step 1102, memory device 200 may perform a memory read or write operation. For example, in response to receiving a request for data stored in memory arrays, memory device 200 may perform a read operation using registers in the memory to extract data. Alternatively, or additionally, in step 1102 memory device 200 may perform a writing operation to modify cells in memory device 200. Further, memory device 200 may perform erasing operations in step 1102.

In step 1104, memory device 200 determines status of the data being read or written using a status check operation. For example, memory device 200 may perform validation operations, syndrome calculation, and/or error locations to determine the status of data.

In step 1106, memory device 200 may determine whether an error was encountered in bits or data chunks of the information being read from, or written to, memory device 200. If memory device 200 determines there was no error detected (step 1106: No), memory device 200 continues to step 1108, generate a no error status code, and continue directly to step 1124. In step 1124, memory device 200 transmits data chunks (e.g., information retrieved from the memory), status codes, and/or aggregated information of status codes. For example, in step 1124 memory device 200 may output data chunks through I/O pins 220 while simultaneously outputting status codes through status pin 216. However, if in step 1106 memory device 200 encounters an error in bits or data chunks (step 1106: Yes), memory device 200 continues to step 1110 and generates an error status code. The error status code encodes status such as an error was detected, a number of fail data chunks, a location of fail bits, or a threshold voltage of a memory cell in the memory device storing fail bits. Additionally, or alternatively, the error status code may encode a status indicating the memory device location of the fail bits, a fail data chunk location of the fail bits, and/or the memory device location of the fail chunk.

In step 1112, memory device 200 determines whether status codes are being accumulated. In some embodiments, error indication status codes are accumulated to provide a compiled result of status codes during a time interval, which may start with a triggering event and end with a read command. In such embodiments, accumulated status codes may indicate whether any error occurred since a specific operation (or event) occurred. For example, an accumulated status code may indicate whether any error has occurred in memory device 200 since last power-up. Alternatively, or additionally, accumulated error status codes may indicate whether any error occurred in memory device 200 since the last "clear error" command. As an alternative, however, memory device 200 may be configured to only indicate status codes with respect to the last data transmission and/or a data chunk outputted immediately before receiving the read status command. For example, memory device 200 may be configured to present an indication of whether the error occurred during last data chunk access, which may include read/program/erase of the chunk. Therefore, in step 1112 memory device 200 may determine whether the status will be accumulated or if the status will be for immediately previous data.

If memory device 200 determines that status codes are being accumulated (step 112: Yes), memory device 200 continues to step 1114 and adds a status code to an aggregator. In such embodiments, the aggregated status code may indicate an accumulated error status during the period of memory operation, where the period of memory operation may start when the memory device receives a trigger command via I/O pins 220 and ends when the memory device receives a read command via I/O pins 220. The trigger command may include a clear error command, a factory reset command, and/or a power-on command. Further, in some embodiments, the aggregator may be started with the triggering event, such as the clear error command or the power-on command. However, if memory device 200 determines that status codes are not being accumulated (step 1112: No), memory device skips step 1114 and continues directly to step 1116.

In step 1116, memory device 200 performs a correction for the error encountered in step 1106. For example, memory device 200 may apply a memory correction method such as single-error correction and double-error detection (SECDED) Hamming code, to correct a single-bit error. Alternatively, or additionally, other correction methods such as extra parity bit or Chipkill ECC may be employed to correct bit errors.

In step 1118, memory device 200 performs a second memory read or write operation. In some embodiments, the operation performed in step 1118 may replicate the operation in step 1102. Based on the second memory read or write operation in step 1118, in step 1120 memory device 200 determines a status with a status check of the newly retrieved or received data. For example, in step 1120 memory device 200 may replicate the status check operation performed in step 1104.

In step 1122, memory device 200 generates a second status code. The code may encode whether the correction operation was successful or whether the error encountered in step 1106 was uncorrectable. In embodiments that use status code accumulation, memory device 200 may update the aggregator based on the new status check operation in step 1122. However, if memory device 200 operates without accumulation, in step 1122 memory device 200 may discard previous status codes and simply store the new status code based on the operation in step 1120.

In step 1124, memory device 200 transmits data chunks, status code(s), or the aggregated status codes. In some embodiments, step 1124 may include engaging I/O pins 220 or other of the pins in memory device 200, such as CE pins 222, to transmit information and/or status codes. Data chunks and status codes may be outputted simultaneously through different pins of memory device 200.

Figure 12:
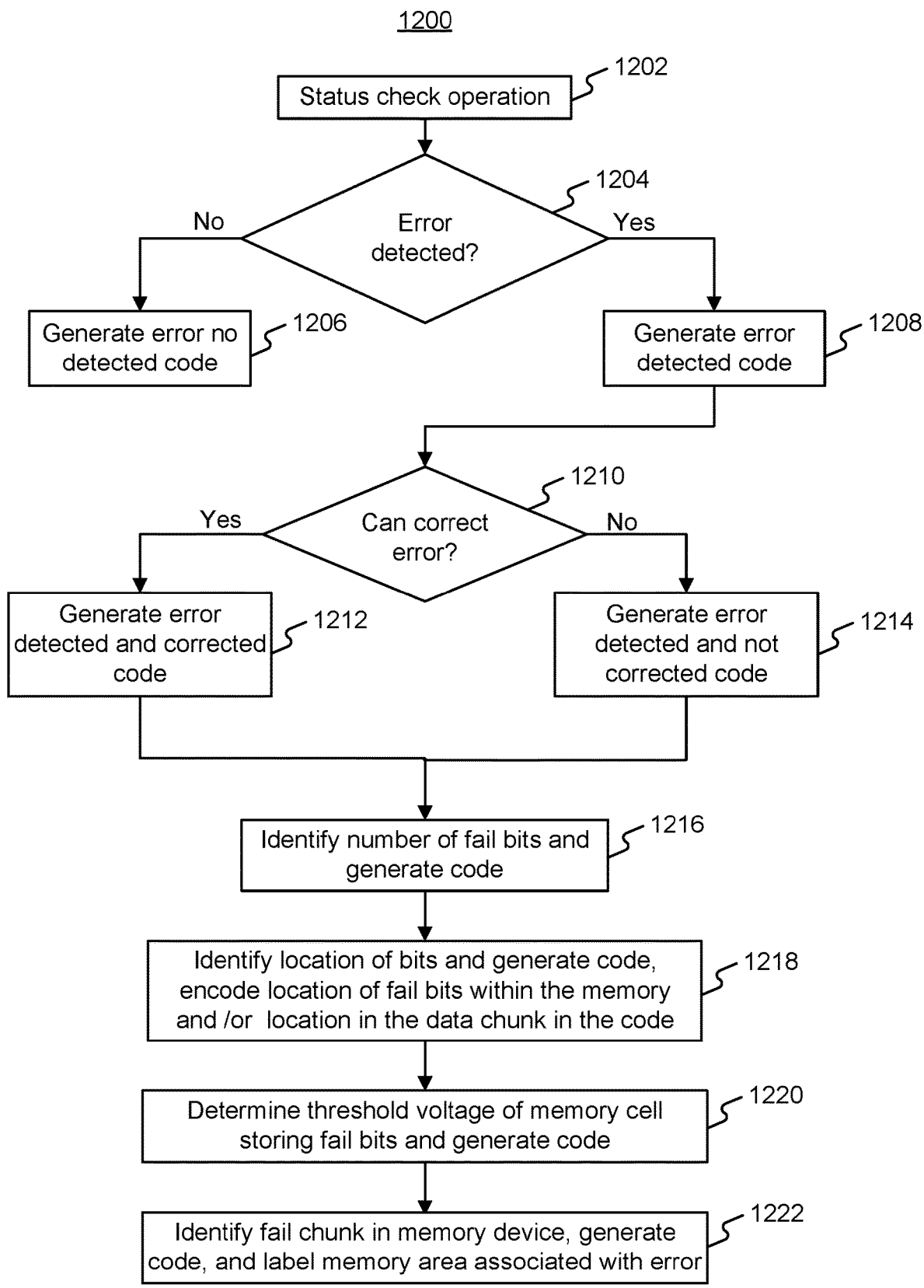
FIG. 12 is a flow chart showing a method for performing status check operations in a memory device according to an exemplary embodiment.

FIG. 12 is a flow chart showing a method 1200 for performing status check operations in a memory device according to an exemplary embodiment. Method 1200 may be performed by one or more elements of memory devices 200, 400, and 600. For example, method 1200 may be performed by ECC 210. In other embodiments, however, method 1200 may be performed by a combination of elements in memory device 200. For example, method 1200 may be performed by ECC 210 in combination with correction circuit 212. Further, method 1200 may be performed by ECC 210, correction circuit 212, and data processing circuit 214 in combination.

The description of method 1200 below uses memory device 200 as an exemplary element performing method 1200. However, other memory devices (e.g., memory device 400 or memory device 600) or specific elements of the memory devices (e.g., ECC 210) may perform method 1200.

In step 1202, memory device 200 initiates a status check operation. For example, in response to a read status command memory device 200 may begin a status evaluation process for data chunks. The status check or evaluation may include identifying errors, calculating syndromes, or executing validation operations.

In step 1204, memory device 200 determines if an error is detected as part of the status check operation. If no error is detected (step 1204: No), memory device 200 continues to step 1206 and generates a no error code. However, if an error is detected (step 1204: Yes), memory device 200 continues to step 1208 and generates an error code. For example, ECC 210 may engage encoder 926 (FIG. 9) to generate an error code based on the detected error.

In step 1210, memory device 200 determines if the error can be corrected. For example, based on the location, size, and available redundant information, memory device 200 may determine if the error identified in step 1204 may be corrected. If memory device 200 determines the error can be corrected (step 1210: Yes), memory device 200 continues to step 1212 and generates an error detected and corrected code. If, however, memory device 200 determines the error cannot be corrected (step 1210: No), memory device 200 continues to step 1214 and generate an error detected and not corrected code.

In step 1216, memory device 200 identifies a number of fail bits. In some embodiments, the number of fail bits may be identified when the error is detected in step 1204. In other embodiments, the number of fail bits may be determined by an iterative process, processing the registers in memory device 200. In both embodiments, memory device 200 generates a code encoding the number of fail bits in step 1216.

In step 1218, memory device 200 identifies locations of fail bits and generates a code. The location encoded in step 1218 may be the locations of fail bits within the memory and/or the locations of failed bits in the data chunk. For example, memory device 200 may encode a location of the memory array where the fail bits were encountered to prevent using the same area in future operations. Alternatively, or additionally, memory device 200 may encode a location within the byte or word in step 1218.

In step 1220, memory device 200 determines a threshold voltage of each memory cell storing faulty bits. For example, memory device 200 may query the voltage of cells where the error was detected in step 1204. Further, in step 1220 memory device 200 may generate a code encoding the threshold voltage of faulty memory cells.

In step 1222, memory device 200 identifies a fail chunk, generates an associated error status code, and places a label or flag in the memory area associated with the error. For example, based on the memory area associated with errors detected in step 1204, memory device 200 may identify a faulty area of normal array 202 and label it so that a system interface may avoid accessing the particular memory area that has errors.

Method 1200 may be performed to identify multiple error types and allows memory devices to perform status check operations under different configurations. For example, in some embodiments an indication bit to indicate whether the error occurred during a last data chunk access (can be read/program/erase of the chunk). In such embodiments, memory devices may follow a sequence of operations for the status check including: (1) do memory read (with data error occurrence); (2) do check status; (3) do memory read again without error occurrence; and (4) second status check. The $1^{st}$ status check, in operation (2), may show error, while the $2^{nd}$ status check result, in operation (4), may show no error. In other embodiments, method 1200 may be employed for error indication statuses that are accumulated. In such embodiments, status codes may inform whether any error occurred since a specific operation (or event) occurred. For example, as previously disclosed with respect to the aggregator in step 1112, memory devices may aggregate error detections to generate an error code indicating whether any error occurred since last power-up of the memory device or whether any error occurred since last "clear error" command was accepted by the memory device.

Figure 13:
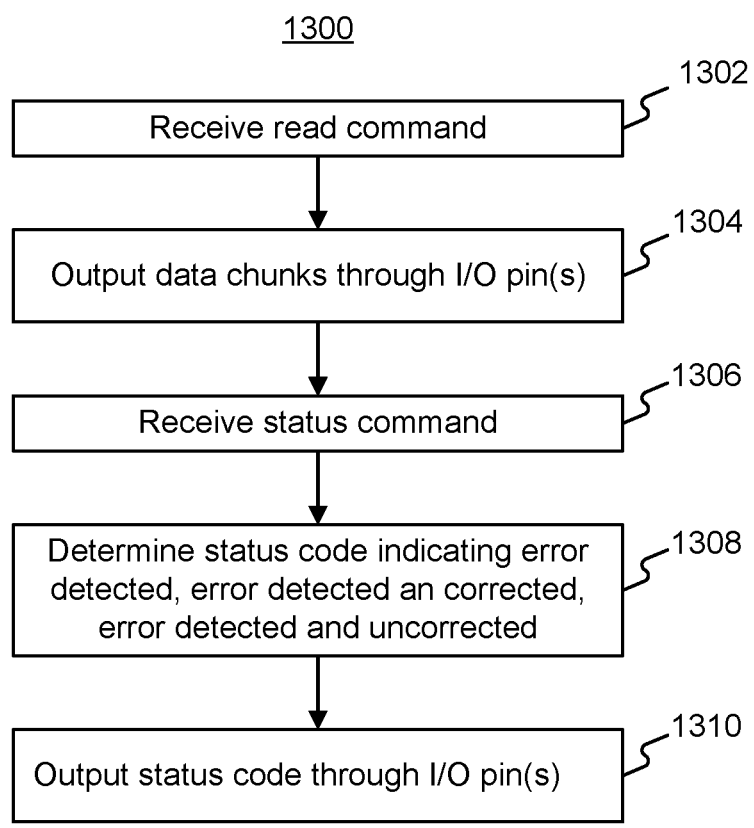
FIG. 13 is a flow chart showing a method for outputting status codes from a memory device according to an exemplary embodiment.

FIG. 13 is a flow chart showing a method 1300 for outputting status codes according to an exemplary embodiment. Method 1300 may be performed by one or more elements of memory devices 200, 400, and 600. For example, method 1300 may be performed by ECC 210. In other embodiments, however, method 1300 may be performed by a combination of elements in memory devices. For example, method 1300 may be performed by ECC 210 in combination with correction circuit 212. Further, method 1200 may be performed by ECC 210, correction circuit 212, and data processing circuit 214 in combination.

The description of method 1300 below uses memory device 200 as an exemplary element performing method 1300. However, other memory devices (e.g., memory device 400 or memory device 600) or specific elements of the memory devices (e.g., ECC 210) may perform method 1300.

In step 1302, memory device 200 receives a read command. For example, memory device 200 may receive a read command on I/O pins 220. Further, in step 1302, as part of the read command, memory device 200 may receive signals on other pins of memory device 200, such as CE pins 222, to enable the read command.

In step 1304, memory device 200 outputs data chunks through I/O pins 220. When memory device 200 includes a parallel flash memory device, data chunks may be output simultaneously on I/O pins 220. When memory device 200 includes a serial flash memory device, data chunks may be sequentially outputted on I/O pins 220 based on clock signals.

In step 1306, memory device receives a status command. For example, via I/O pins 220 memory device 200 may receive a request for status or status codes from a system interface. In step 1308, memory device 200 determines a status code indicating at least one of: an error was detected, an error was detected and corrected, or an error was detected but uncorrected. In some embodiments, memory device 200 may determine the status code using ECC 210.

In step 1310, memory device 200 outputs a status code generated in step 1308 on I/O pins 220 (FIG. 2). In alternative embodiments, status pins, such as status pins 402 (FIG. 4), may be used to output the status code. In some embodiments, in step 1310 memory device 200 may be concurrently outputting status codes and data chunks. For example, memory device 200 may output data chunks using I/O pins 220 while simultaneously outputting a status code serially on status pin 216.

The status code outputted in step 1310 may specify the indicated error information, such as location, error number, or threshold voltage. These indications of error may have one or more bits, transmitted serially or in parallel using status pins. Further, the indicated error may specify any of the number of errors in the data chunk, the total fail bit number in the memory device, the number of error chunks in the memory device, the number of error events that have occurred since last power-up of the memory device, number of error events that have occurred since the device was shipped from factory. As previously discussed, in connection to encoder 926 (FIG. 9), the status code may encode this information of one or more detected errors. In some embodiments, status codes outputted in step 1310 and determined in step 1308 may generally indicate the error location, which may be information about which data chunk(s) has error. In such embodiments, memory devices can identify anomalous or defective arrays in the memory and communicate them to a system interface. Then, the system operating the memory device may effectively avoid accessing the particular memory area that has error.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

Moreover, while illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Further, with respect to the exemplary methods illustrated in the attached drawings, the order and sequence of steps may be modified, and steps may be added or deleted.

Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments.

The claims are to be interpreted broadly based on the language employed in the claims and not limited to examples described in the present specification, which examples are to be construed as non-exclusive. Further, the steps of the disclosed methods may be modified in any manner, including by reordering steps and/or inserting or deleting steps.

What is claimed is:

1. A memory device comprising:
an error code generator;
one or more first pins coupled to an external data bus; and
one or more second pins coupled to an external system interface,
wherein
the one or more first pins output data chunks to the data bus during a period of memory operation;
the error code generator is configured to transmit a status code via the one or more second pins during the period of memory operation, the status code indicating at least one of:
an error was detected;
an error was detected and corrected; or
an error was detected and not corrected,
wherein
the status code further indicates an accumulated error status during the period of memory operation, and
the period of memory operation starts when the memory device receives a trigger command via the one or more first pins.

2. The memory device of claim 1, wherein
the memory device is a parallel flash memory;
the one or more first pins comprise at least eight pins; and
the memory device further comprises:
one or more third pins to receive a memory enabling signal;
one or more fourth pins to receive a write mode signal; and
one or more fifth pins to receive an output mode signal.

3. The memory device of claim 1, wherein
the memory device is a serial flash memory;
the one or more first pins comprise a single pin; and
the memory device further comprises:
one or more third pins to receive a selection signal; and
one or more fourth pins to receive a clock signal.

4. The memory device of claim 1, wherein
the period of memory operation ends when the memory device receives a read command via the one or more first pins.

5. The memory device of claim 4, wherein the trigger command comprises a clear error command.

6. The memory device of claim 4, wherein the trigger command comprises a power on command.

7. The memory device of claim 1, wherein the error code generator is configurable via the system interface to generate customized status codes.

8. The memory device of claim 1, wherein the one or more second pins use at least one of a normal output buffer or an open drain type output buffer.

9. The memory device of claim 1, further comprising:
one or more NMOS devices; and
one or more PMOS devices;
wherein:
each one of the NMOS devices is connected in series with a corresponding one of the PMOS devices;
each of the one more or more second pins is connected to a corresponding one of the NMOS devices;
the error code generator is coupled to gates of the NMOS devices and gates of the PMOS devices; and
the error code generator is configured to:
turn on at least one of the NMOS devices when no error is detected during the period of memory operation; and
turn on at least one of the PMOS devices when an error is detected during the period of memory operation.

10. The memory device of claim 1, further comprising:
one or more NMOS devices,
wherein
each of the one or more status pins is coupled to a corresponding one of the NMOS devices;
the error code generator is coupled to gates of the NMOS devices; and
the error code generator is configured to:

turn on at least one of the NMOS devices when no error is detected during the period of memory operation; and turn off at least one of the NMOS devices when an error is detected during the period of memory operation.

11. The memory device of claim 1, wherein the one or more second pins comprise eight pins; and the status code is one byte long.

12. A memory device comprising:

one or more first pins;

one or more second pins; and at least one processor configured to perform operations comprising:

receiving a read status command;

upon receiving the read status command, determining an error status code of the memory device; and outputting data chunks through the one or more first pins while simultaneously outputting the error status code through the one or more second pins during an entire correctable data period, the error status code being indicative of at least one of:

an error was detected;

an error was detected and corrected;

an error was detected and not corrected;

a number of fail bits;

a number of fail data chunks;

a location of fail bits; or a threshold voltage of a memory cell in the memory device storing fail bits, wherein the status code further indicates an accumulated error status during a period, the period starting when the memory device receives a trigger command via the one or more pins and ending when the memory device receives the read status command via the one or more pins.

13. The memory device of claim 12, wherein the status code is based on a data chunk outputted immediately before receiving the read status command.

14. The memory device of claim 12, wherein the trigger command comprises a clear error command.

15. The memory device of claim 12, wherein the trigger command comprises a power on command.

16. The memory device of claim 12, wherein the trigger command comprises a factory reset command.

17. The memory device of claim 12, wherein the error status code is indicative of the location of fail bits; and the error status code further encodes:

the memory device location of the fail bits;

a fail data chunk location of the fail bits; and the memory device location of the fail chunk.

18. A method for operating a memory device comprising:

outputting data chunks through one or more first pins coupled to an external data bus;

determining an accumulated status code in response to receiving a status command;

outputting the accumulated status code through one or more second pins coupled to an external system interface, wherein the accumulated status code indicates whether any error occurred since a last clear error command; and the one or more first pins output the data chunks while the second pins output the accumulated status code simultaneously with the data chunks during an entire correctable data period.

* * * * *